US008788896B2

(12) United States Patent
Tekumalla

(10) Patent No.: US 8,788,896 B2
(45) Date of Patent: Jul. 22, 2014

(54) SCAN CHAIN LOCKUP LATCH WITH DATA INPUT CONTROL RESPONSIVE TO SCAN ENABLE SIGNAL

(75) Inventor: Ramesh C. Tekumalla, Breinigsville, PA (US)

(73) Assignee: LSI Corporation, San Jose, CA (US)

( * ) Notice: Subject to any disclaimer, the term of this patent is extended or adjusted under 35 U.S.C. 154(b) by 273 days.

(21) Appl. No.: 13/348,357

(22) Filed: Jan. 11, 2012

(65) Prior Publication Data

US 2013/0179742 A1 Jul. 11, 2013

(51) Int. Cl.
*G01R 31/28* (2006.01)

(52) U.S. Cl.
USPC ............................................ 714/726; 714/30

(58) Field of Classification Search
CPC ............................................... G01R 31/318536
USPC .................................... 714/726, 727, 729, 30
See application file for complete search history.

(56) References Cited

U.S. PATENT DOCUMENTS

| 5,390,190 | A | 2/1995 | Nanda et al. | |
|---|---|---|---|---|
| 7,487,417 | B2 | 2/2009 | Branch et al. | |
| 7,613,967 | B1 | 11/2009 | Tan | |
| 7,747,917 | B2 | 6/2010 | Putman et al. | |
| 7,823,034 | B2 * | 10/2010 | Wohl et al. | 714/726 |
| 7,831,876 | B2 | 11/2010 | Goyal et al. | |
| 7,949,916 | B1 * | 5/2011 | Ang | 714/726 |
| 7,975,196 | B2 * | 7/2011 | Whetsel | 714/727 |
| 8,122,413 | B2 * | 2/2012 | Hom et al. | 716/116 |
| 8,127,188 | B2 * | 2/2012 | Hasegawa | 714/731 |
| 8,539,291 | B2 * | 9/2013 | Whetsel | 714/727 |
| 2007/0022336 | A1 | 1/2007 | Branch et al. | |
| 2007/0198882 | A1 | 8/2007 | Namura et al. | |
| 2009/0189662 | A1 | 7/2009 | Uchida | |
| 2011/0181331 | A1 * | 7/2011 | Srivastava et al. | 327/215 |

FOREIGN PATENT DOCUMENTS

KR 20040040899 A 5/2004

OTHER PUBLICATIONS

M. Omana et al., "High-Performance Robust Latches," IEEE Transactions on Computers, Nov. 2010, pp. 1455-1465, vol. 59, No. 11.
K.Y. Chung et al., "Design and Test of Latch-Based Circuits to Maximize Performance, Yield, and Delay Test Quality," International Test Conference, Paper 3.3, 10 pages.

(Continued)

*Primary Examiner* — Esaw Abraham
(74) *Attorney, Agent, or Firm* — Ryan, Mason & Lewis, LLP

(57) ABSTRACT

A scan chain lockup latch comprises at least one latching element and data input control circuitry configured to control application of data to a data input of the latching element responsive to a scan enable signal. The lockup latch is configured for coupling between first and second scan cells of a scan chain. The scan chain may be controllable between a scan shift mode of operation and a functional mode of operation responsive to the scan enable signal. The data input control circuitry may be configured to maintain the data input of the latching element at a constant logic value when the scan chain is in its functional mode of operation such that switching activity in the latching element is suppressed. The scan chain lockup latch and the associated scan chain may be implemented in scan test circuitry of an integrated circuit, for testing additional circuitry of that integrated circuit.

18 Claims, 6 Drawing Sheets

(56) References Cited

OTHER PUBLICATIONS

K. Yoshikawa et al., "Timing Optimization by Replacing Flip-Flops to Latches," Proceedings of the Conference on Asia South Pacific Design Automation: Electronic Design and Solution Fair, Jan. 2004, 6 pages, Yokohama, Japan.

Joshua P. Zelman, "A Formal Verification Methodology for a Fully Abutted Hierarchical Design," International Cadence Usersgroup Conference, Sep. 2004, 27 pages, Santa Clara, California.

K.Y. Chung et al., "Structural Delay Testing of Latch-Based High-Speed Pipelines with Time Borrowing," IEEE International Test Conference (ITC), Sep.-Oct. 2003, Paper 42.1, pp. 1089-1097.

K.Y Chung et al., "Design and Test of Latch-Based Circuits to Maximize Performance, Yield, and Delay Test Quality," IEEE International Test Conference (ITC), Nov. 2010, Paper 3.3, pp. 1-10.

M. Omana et al., "High-Performance Robust Latches," Computers, IEEE Transactions on Computers, Nov. 2010, pp. 1455-1465, vol. 59, No. 11.

U.S. Appl. No, 13/280,797 filed in the name of R.C. Tekumalla et al. Oct. 25, 2011 and entitled "Dynamic Clock Domain Bypass for Scan Chains."

\* cited by examiner

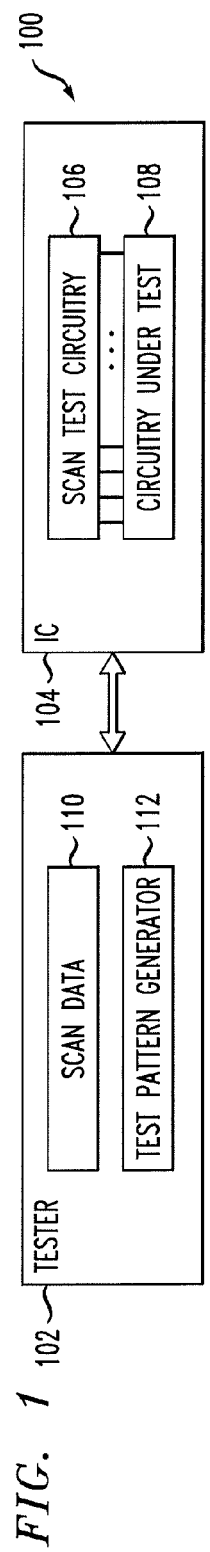
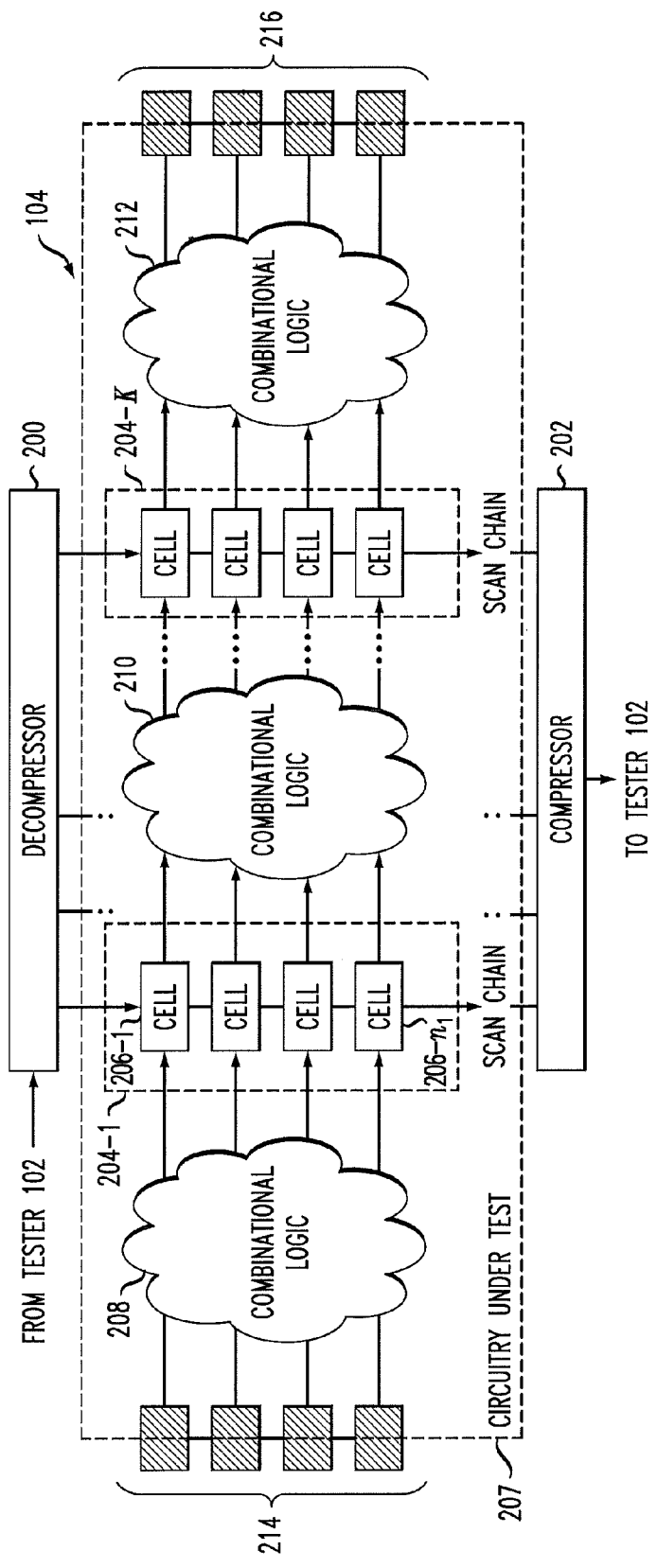
FIG. 1
FIG. 2

SCAN CHAIN LOCKUP LATCH WITH DATA INPUT CONTROL RESPONSIVE TO SCAN ENABLE SIGNAL

BACKGROUND

Integrated circuits are often designed to incorporate scan test circuitry that facilitates testing for various internal fault conditions. Such scan test circuitry typically comprises scan chains comprising multiple scan cells. The scan cells may be implemented, by way of example, utilizing respective flip-flops. The scan cells of a given scan chain may be configured to form a serial shift register for applying test patterns at inputs to combinational logic of the integrated circuit. The scan cells of the given scan chain are also used to capture combinational logic outputs responsive to applied test patterns.

In one exemplary arrangement, an integrated circuit with scan test circuitry may have a scan shift mode of operation and a functional mode of operation. A flag may be used to indicate whether the integrated circuit is in scan shift mode or functional mode. In the scan shift mode, the flip-flops of the scan chain are configured as a serial shift register. A test pattern is then shifted into the serial shift register formed by the flip-flops of the scan chain. Once the desired test pattern has been shifted in, the scan shift mode is disabled and the integrated circuit is placed in its functional mode. Internal combinational logic results occurring during this functional mode of operation are then captured by the chain of scan flip-flops. The integrated circuit is then once again placed in its scan shift mode of operation, in order to allow the captured combinational logic results to be shifted out of the serial shift register formed by the scan flip-flops, as a new test pattern is being scanned in. This process is repeated until all desired test patterns have been applied to the integrated circuit.

Many scan chains also incorporate lockup latches. For example, in scan chains that have multiple clock domains, lockup latches are commonly utilized to ensure that scan shift timing requirements are met at transitions between the clock domains. However, movement of scan cells during integrated circuit design can cause design verification complications in relation to positioning of the lockup latches. Also, conventional lockup latches can consume significant amounts of power outside of the scan shift mode of operation.

SUMMARY

One or more illustrative embodiments of the invention provide scan chain lockup latches that include data input control circuitry for controlling application of data to latching elements of the lockup latches. Such an arrangement can significantly reduce switching activity and thus power consumption during a functional mode of operation of an integrated circuit scan chain, while also facilitating design verification.

In one embodiment, a scan chain lockup latch comprises at least one latching element and data input control circuitry configured to control application of data to a data input of the latching element responsive to a scan enable signal. The lockup latch is configured for coupling between first and second scan cells of a scan chain.

The scan chain may be controllable between a scan shift mode of operation and a functional mode of operation responsive to the scan enable signal. The data input control circuitry may be configured to maintain the data input of the latching element at a substantially constant logic value when the scan chain is in its functional mode of operation such that switching activity in the latching element is suppressed. The scan chain lockup latch and the associated scan chain may be implemented in scan test circuitry of an integrated circuit, for testing additional circuitry of that integrated circuit.

BRIEF DESCRIPTION OF THE DRAWINGS

FIG. 1 is a block diagram showing an integrated circuit testing system comprising a tester and an integrated circuit under test in an illustrative embodiment.

FIG. 2 illustrates one example of the manner in which scan chains of scan test circuitry may be arranged between combinational logic in the integrated circuit of FIG. 1.

DETAILED DESCRIPTION

Figure 3:
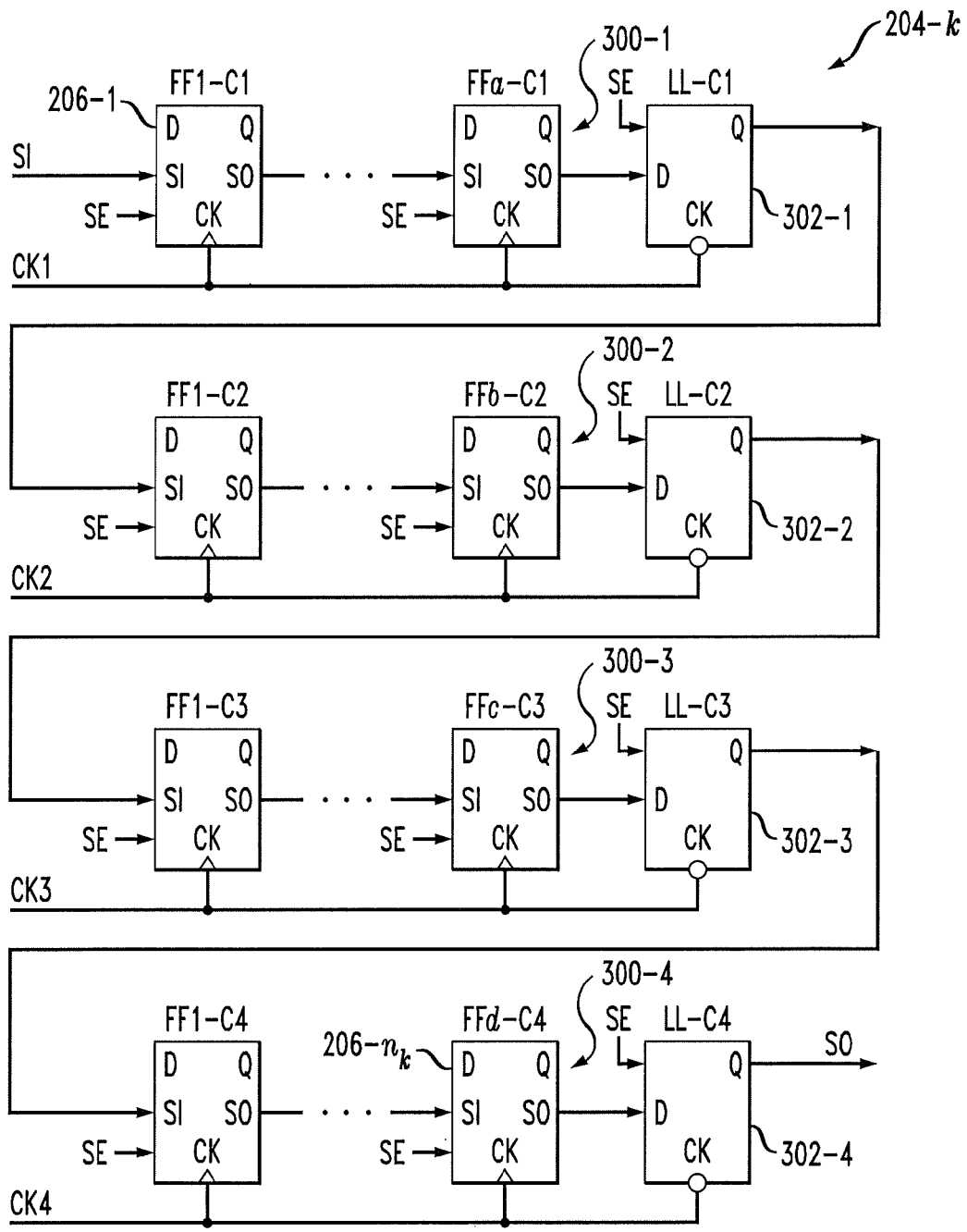
FIG. 3 shows a more detailed view of one of the scan chains of FIG. 2 including multiple clock domains with lockup latches arranged between the clock domains.

Embodiments of the invention will be illustrated herein in conjunction with exemplary testing systems and corresponding integrated circuits comprising scan test circuitry for supporting scan testing of additional circuitry of those integrated circuits. It should be understood, however, that embodiments of the invention are more generally applicable to any testing system or associated integrated circuit in which it is desirable to provide improved scan testing performance by reducing power consumption associated with scan chain lockup latches in a functional mode of operation.

FIG. 1 shows an embodiment of the invention in which a testing system 100 comprises a tester 102 and an integrated circuit under test 104. The integrated circuit 104 comprises scan test circuitry 106 coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112. In other embodiments, at least a portion of the tester 102, such as the test pattern generator 112, may be incorporated into the integrated circuit 104. Alternatively, the entire tester 102 may be incorporated into the integrated circuit 104, as in a built-in self-test (BIST) arrangement.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

The integrated circuit 104 may be configured for installation on a circuit board or other mounting structure in a computer, server, mobile telephone or other type of communication device. Such communication devices may also be viewed as examples of what are more generally referred to herein as "processing devices." The latter term is also intended to encompass storage devices, as well as other types of devices comprising data processing circuitry.

Embodiments of the present invention may be configured to utilize compressed or noncompressed scan testing, and embodiments of the invention are not limited in this regard. However, the illustrative embodiment shown in FIG. 2 will be described primarily in the context of compressed scan testing.

Referring now to FIG. 2, portions of one potential configuration of the integrated circuit 104 are shown in greater detail. In this compressed scan testing arrangement, the scan test circuitry 106 comprises a decompressor 200, a compressor 202, and a plurality of scan chains 204-$k$, where $k=1, 2, \ldots K$.

Each of the scan chains 204 comprises a plurality of scan cells 206, and is configurable to operate as a serial shift register in a scan shift mode of operation of the integrated circuit 104 and to capture functional data from circuitry under test 207 in a functional mode of operation of the integrated circuit 104. The scan chains 204 may be associated with multiple distinct clock domains, or a single clock domain.

It will be assumed in some embodiments that at least one of the scan chains 204 is a multiple clock domain scan chain, that is, a scan chain comprising sub-chains associated with respective distinct clock domains.

As will be described in greater detail below, such sub-chains of a multiple clock domain scan chain may be separated from one another by lockup latches. A given such lockup latch in an embodiment of the present invention comprises at least one latching element, such as a flip-flop, and data input control circuitry configured to control application of data to a data input of the latching element responsive to a scan enable signal. The lockup latch is configured for coupling between first and second scan cells of a scan chain. The term "lockup latch" as used herein is intended to be broadly construed, so as to encompass any type of latching circuitry that comprises at least one latching element, such as a flip-flop, and is suitable for coupling between scan cells of a scan chain, for example, in order to facilitate the meeting of timing requirements between clock domains of the scan chain.

It should be appreciated, however, that lockup latches of the type disclosed herein can be utilized in other applications, and are therefore not limited to use in separating clock domains of a scan chain.

In some embodiments, at least a given one of the scan chains 204 may be controllable between a scan shift mode of operation and a functional mode of operation responsive to the scan enable signal, and the data input control circuitry may be configured to maintain the data input of the latching element at a substantially constant logic value when the scan chain is in its functional mode of operation such that switching activity in the latching element is suppressed in the functional mode. The terms "scan shift mode" and "functional mode" as used herein are intended to encompass such modes as implemented in only portions of the integrated circuit 104, such as in a set of scan chains and portions of the integrated circuit to be tested using those scan chains. Thus, such modes may refer to respective modes of operation of one or more scan chains, or of an entire integrated circuit.

The scan chains 204 are generally arranged in parallel with one another between respective outputs of the decompressor 200 and respective inputs of the compressor 202, such that in the scan shift mode of operation, scan test input data from the decompressor 200 is shifted into the scan chains 204 and scan test output data is shifted out of the scan chains 204 into the compressor 202.

The first scan chain 204-1 is of length $n_1$ and therefore comprises $n_1$ scan cells denoted 206-1 through 206-$n_1$. More generally, scan chain 204-$k$ is of length $n_k$ and therefore comprises a total of $n_k$ scan cells.

In some embodiments of the invention, the lengths of the scan chains 204 are balanced so that the same amount of time is needed to shift the desired set of scan test patterns into all of the scan chains. It may therefore be assumed without limitation that all of the scan chains 204 are of the same length n, such that $n_1=n_2=\ldots=n_k=n$.

Circuitry under test 207 in this embodiment comprises a plurality of combinational logic blocks, of which exemplary blocks 208, 210 and 212 are shown. The combinational logic blocks are illustratively arranged between primary inputs 214 and primary outputs 216 and separated from one another by the scan chains 204.

Combinational logic blocks such as 208, 210 and 212 may be viewed as examples of what are more generally referred to herein as "additional circuitry" that is subject to testing utilizing scan test circuitry in embodiments of the invention. By way of example, such internal circuitry blocks of integrated circuit 104 may represent portions of different integrated circuit cores, such as respective read channel and additional cores of a system-on-chip (SOC) integrated circuit in a hard disk drive (HDD) controller application, designed for reading and writing data from one or more magnetic storage disks of an HDD. In other embodiments, the circuit blocks subject to testing by the scan chains may comprise other types of functional logic circuitry, in any combination, and the term "additional circuitry" is intended to be broadly construed so as to cover any such arrangements of logic circuitry.

The decompressor 200 of the scan test circuitry 106 receives compressed scan data from the tester 102 and decompresses that scan data to generate scan test input data that is shifted into the scan chains 204 when such chains are configured as respective serial shift registers in the scan shift mode of operation. The compressor 202 of the scan test circuitry 106 receives scan test output data shifted out of the scan chains 204, also when such chains are configured as respective serial shift registers in the scan shift mode of operation, and compresses that scan test output data for delivery back to the tester 102.

Compressed scan input data is applied by tester 102 to M scan inputs of decompressor 200, and compressed scan output data is provided from compressor 202 back to tester 102 via M scan outputs. As noted previously, the K scan chains 204 are arranged in parallel between respective outputs of the decompressor 200 and respective inputs of the compressor 202 as shown. Each of the individual scan chains 204 is configurable to operate as a serial shift register in the scan shift mode of operation of the integrated circuit 104 and also to capture functional data from combinational logic elements in the functional mode of operation of the integrated circuit 104.

The number K of scan chains 204 is generally much larger than the number M of decompressor inputs or compressor outputs. The ratio of K to M provides a measure of the degree of scan test pattern compression provided in the scan test circuitry 106. It should be noted, however, that the number of compressor outputs need not be the same as the number of decompressor inputs. For example, there may be M decompressor inputs and P compressor outputs, where M≠P but both M and P are much smaller than K.

The scan inputs of the decompressor 200 may be viewed as corresponding to respective ones of what are more generally referred to herein as "scan channels" of the integrated circuit 104.

Additional details regarding the operation of scan compression elements such as decompressor 200 and compressor 202 may be found in U.S. Pat. No. 7,831,876, entitled "Testing a Circuit with Compressed Scan Subsets," which is commonly assigned herewith and incorporated by reference herein. Again, scan compression elements such as decompressor 200 and compressor 202 may not be present in other embodiments of the invention. In an embodiment of the invention without scan compression, where the decompressor 200 and compressor 202 are eliminated, the scan channels may simply correspond to respective ones of the scan chains 204.

A given test pattern applied to the scan chains 204 in the present embodiment may be viewed as a scan vector, where a scan vector comprises a shift-in phase in which scan test input data is shifted into all of the scan chains 204, followed by a capture phase in which functional data is captured, followed by a shift-out phase in which scan test output data is shifted out from all of the scan chains 204. The scan vectors for different test patterns may overlap with one another, in that as input data is shifted in for a given test pattern, captured data for a previous pattern may be shifted out. The shift-in and shift-out phases may be individually or collectively referred to herein as one or more scan shift phases of the scan vector or associated test pattern.

Embodiments of the invention are configured to incorporate one or more lockup latches into each of one or more of the scan chains 204, in order to, for example, separate multiple clock domains of those scan chains so as to ensure that scan shift timing requirements are met, as will be described below in conjunction with FIGS. 3, 4, 5 and 6.

As indicated previously, important issues relating to integrated circuit scan testing include design verification and power consumption. The scan test circuitry 106 in the present embodiment addresses these issues by configuring the lockup latches to include scan enable based data input control.

FIG. 3 shows a particular scan chain 204-k of the scan test circuitry 106 in greater detail. The scan chain as shown is an example of what is more generally referred to herein as a multiple clock domain scan chain, that is, a scan chain that includes a plurality of sub-chains associated with respective distinct clock domains of the integrated circuit 104.

Each of the sub-chains 300 in this embodiment of the invention includes two or more scan cells 206. More particularly, the scan chain 204-k comprises scan cells 206-1 through 206-$n_k$, grouped into four sub-chains 300-1, 300-2, 300-3 and 300-4 associated with respective clock signals CLK1, CLK2, CLK3 and CLK4. In this embodiment, each of the clock signals CLK1, CLK2, CLK3 and CLK4 is assumed to be associated with a different clock domain of the integrated circuit 104, and thus this set of clock signals may comprise asynchronous clocks. It is to be appreciated, however, that the term "clock domain" as used herein is intended to be broadly construed, and accordingly should not be viewed as requiring or foreclosing any particular relationship among the clock signals.

Each of the scan cells 206 in the present embodiment has a data input (D), a data output (Q), a scan input (SI), a scan output (SO), a scan enable (SE) input, and a clock input (CK), and may include additional or alternative inputs and outputs that are not explicitly shown. The two or more scan cells 206 of each of the sub-chains 300 are clocked by the corresponding clock signal CLK1, CLK2, CLK3 or CLK4 associated with that sub-chain.

Notation such as D, Q, SI, SO and SE used to denote inputs or outputs of a scan cell or lockup latch herein may also be used to refer to the corresponding signals associated with those inputs or outputs. Also, numerous other types of scan cells or lockup latches may be used in other embodiments, with different sets of inputs and outputs.

The sub-chain 300-1 includes scan cells 206 that are more particularly denoted FF1-C1 through FFa-C1, where a is a variable specifying the total number of scan cells in that sub-chain. Similarly, the sub-chain 300-2 includes scan cells 206 that are more particularly denoted FF1-C2 through FFb-C2, the sub-chain 300-3 includes scan cells 206 that are more particularly denoted FF1-C3 through FFc-C3, and the sub-chain 300-4 includes scan cells 206 that are more particularly denoted FF1-C4 through FFd-C4, where b, c and d are variables specifying the total numbers of scan cells in the respective sub-chains. In the present embodiment, each of a, b, c and d is assumed to be greater than or equal to two. The sub-chains 300 may each have different numbers of scan cells 206, or two or more of the sub-chains may have the same number of scan cells.

The sub-chains 300-1, 300-2, 300-3 and 300-4 in this embodiment are separated from one another by respective lockup latches 302-1, 302-2, 302-3 and 302-4. Each of these lockup latches 302 has a data input (D) that is driven by the scan output SO of the preceding scan cell, and a data output (Q) that for each of the lockup latches other than the final lockup latch 302-4 drives the scan input SI of a following scan cell. Each lockup latch 302 further comprises a scan enable (SE) input for receiving the same scan enable signal that controls each of the scan cells 206, and a clock input (CK) that is clocked by the corresponding clock signal CLK1, CLK2, CLK3 or CLK4. However, the lockup latch clock input is active low while the scan cell clock inputs are active high. Thus, there is an inverse relationship between the clocking of the lockup latch and its preceding scan cell. The lockup latches associated with the sub-chains 300-1, 300-2, 300-3 and 300-4 are more particularly denoted as LL-C1, LL-C2, LL-C3 and LL-C4, respectively.

The lockup latches 302 may be configured to trigger on positive or negative clock edges, depending on the timing requirements of a given embodiment. As indicated previously, the term "lockup latch" as used herein is intended to be broadly construed so as to encompass these and other types of edge-triggered latches, as well as other arrangements of circuitry comprising at least one latching element such as a flip-flop.

In a scan shift mode of operation, the scan chain 204-k is configurable to form a serial shift register that includes all of the sub-chains 300 and the lockup latches 302 that separate those sub-chains. The lockup latches 302 are located at the clock domain crossings between respective pairs of adjacent sub-chains 300, and are configured in this embodiment to ensure that scan shift timing requirements are met despite the presence of the multiple clock domains. For example, the lockup latches 302 may be configured to delay the data by half a clock cycle, so as to ensure that setup and hold times and other timing requirements are met in the scan cells driven by those lockup latches.

It should be noted that one or more of the sub-chains 300 may be selectively bypassed using clock domain bypass circuitry so as to not be part of the serial shift register formed by the scan chain 204-k in the scan shift mode. For example, such clock domain bypass circuitry may be configured to bypass one or more of the sub-chains 300 that are determined to be inactive for a particular test pattern, and the clock domain bypass circuitry may bypass different ones of the sub-chains 300 for different test patterns. Additional details regarding clock domain bypass circuitry that may be utilized in embodiments of the invention may be found in U.S. patent application Ser. No. 13/280,797, filed Oct. 25, 2011 and entitled "Dynamic Clock Domain Bypass for Scan Chains," which is commonly assigned herewith and incorporated by reference herein.

Illustrative embodiments of a given one of the lockup latches 302-1 will now be described in conjunction with FIGS. 4, 5 and 6. One or more of the other lockup latches 302 may each configured in a similar manner, although it should be understood that a scan chain may include a variety of different types of lockup latches.

In each of the embodiments of FIGS. 4, 5 and 6, the lockup latch 302-1 includes a latching element in the form of a flip-flop 400, and data input control circuitry configured to maintain the data input of the latching element at a substantially constant logic value when the scan chain is in its functional mode of operation, such that switching activity in the latching element is suppressed in the functional mode.

By way of example, the scan enable signal SE is driven to a first logic level, which for illustrative purposes in these embodiments will be assumed to be a logic "1" level, also referred to as a logic high level, to place the integrated circuit 104 and its scan chains 204 in the scan shift mode of operation, and is driven to a second logic level, which for illustrative purposes in these embodiments will be assumed to be a logic "0" level, also referred to as a logic low level, to place the integrated circuit 104 and its scan chains 204 in the functional mode of operation, although other types and combinations of operating modes and scan enable signaling may be used in other embodiments of the invention. For example, different portions of the integrated circuit 104 and its associated scan test circuitry 106 may be controlled using separate scan enable signals.

Figure 4A:
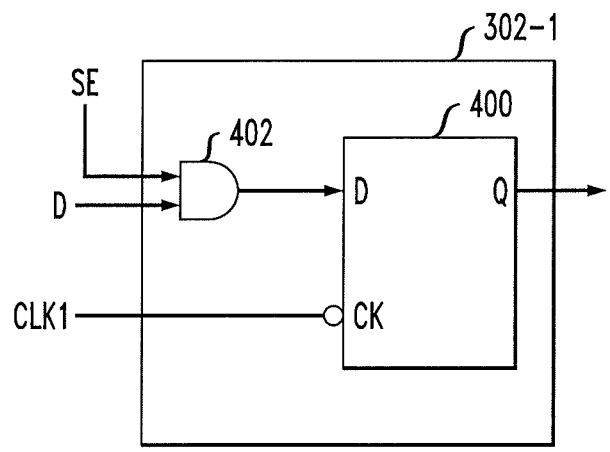
FIGS. 4, 5 and 6 show illustrative embodiments of lockup latches that may be incorporated into one or more of the scan chains of FIG. 2. Each of FIGS. 4, 5 and 6 includes two separate portions, individually denoted A and B, showing different but related embodiments.

Referring now to FIG. 4A, the lockup latch 302-1 comprises flip-flop 400 and data input control circuitry 402. The clock input CK of the flip-flop 400 is driven by the inverse of the clock signal CK1 that drives the scan cells 206 of sub-chain 300-1 of scan chain 204-k. The data input control circuitry 402 in this embodiment generally comprises a two-input AND gate having a first input configured to receive the scan enable signal SE, a second input configured to receive the data signal D, and an output coupled to the data input of the flip-flop 400.

When the SE signal is at its logic high level, the scan chain 204-k is in the scan shift mode of operation, and the data input of the flip-flop 400 receives the data applied to the data input of the lockup latch 302-1.

When the SE signal is at its logic low level, the scan chain 204-k is in the functional mode of operation, and the data input of the flip-flop 400 is maintained at a constant logic value, in this case a logic low level, regardless of any logic level transitions on the data input of the lockup latch 302-1.

As noted above, this can significantly reduce the power consumption of the scan chain in the functional mode. In other embodiments, the data input of the flip-flop 400 may be maintained at a substantially constant logic value. Thus, for example, one or more transitions in the data input may be considered acceptable in a given embodiment, although any such transitions will adversely impact the power consumption. It should be noted in this regard that a "substantially constant logic value" may be viewed in one or more embodiments as a logic value that remains constant for all or nearly all of the functional mode of operation as controlled by the SE signal.

Figure 4B:
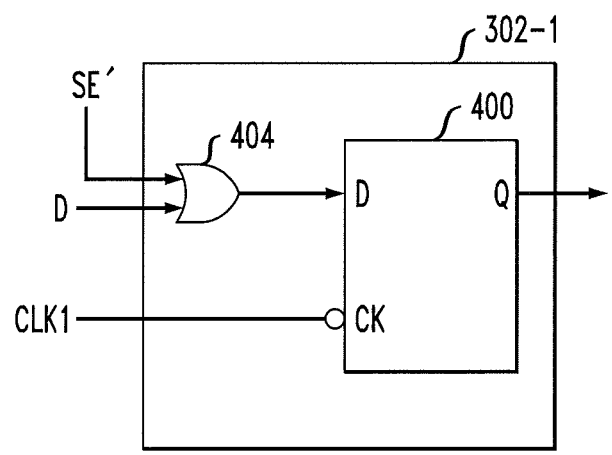

A related embodiment utilizing data input control circuitry 404 comprising a two-input OR gate is shown in FIG. 4B. The operation is similar to the FIG. 4A embodiment, except that the inverse of the scan enable signal SE, which is denoted SE' in the figure, is applied to one of the inputs of the OR gate. Thus, data is applied to the data input of the flip-flop 400 in the scan shift mode of operation when SE' is at a logic low level, but is not applied to the data input of the flip-flop 400 in the functional mode of operation when SE' is at a logic high level. The inverted signal SE' is considered a type of scan enable signal, as that term is intended to be broadly construed herein.

It should be noted that logic circuitry such as the AND gate of FIG. 4A and the OR gate of FIG. 4B may be replaced with other types of logic circuitry in other embodiments, as will be appreciated by those skilled in the art.

Figure 5A:
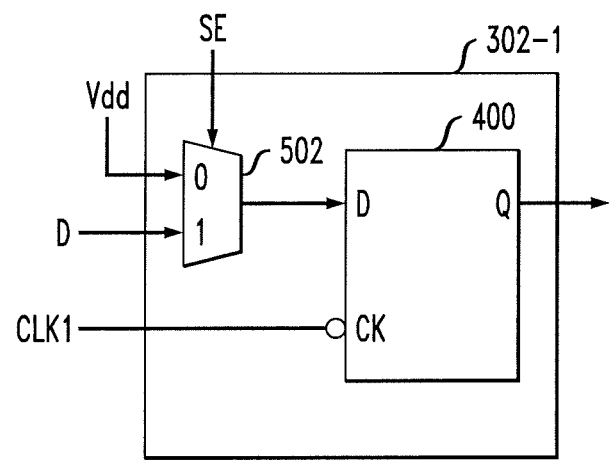
Figure 5B:
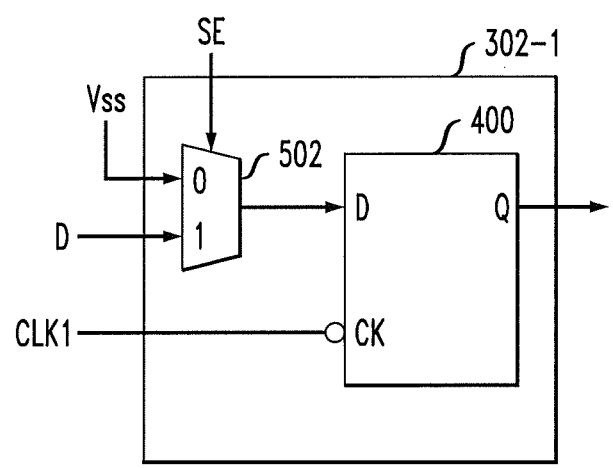

FIGS. 5A and 5B show embodiments in which data input control circuitry 502 comprises a multiplexer having a first selectable input configured to receive data signal D, a second selectable input configured to receive a substantially constant logic value, a control input configured to receive the scan enable signal SE, and an output coupled to the data input of the flip-flop 400. In FIG. 5A, the substantially constant logic value is a logic high value provided by coupling the second selectable input of the multiplexer to a Vdd supply line of the integrated circuit 104, while in FIG. 5B, the substantially constant logic value is a logic low value provided by coupling the second selectable input of the multiplexer to a Vss supply line of the integrated circuit 104. The Vss supply may be ground potential.

Thus, when the SE signal is at a logic high level and the scan chain is in the scan shift mode of operation, the multiplexer selects the data input signal D for application to the data input of the flip-flop 400. When the SE signal is at a logic low level and the scan chain is in the functional mode of operation, the multiplexer selects either Vdd in FIG. 5A or Vss in FIG. 5B for application to the data input of the flip-flop 400, thereby preventing application of data to the data input of the flip-flop.

Figure 6A:
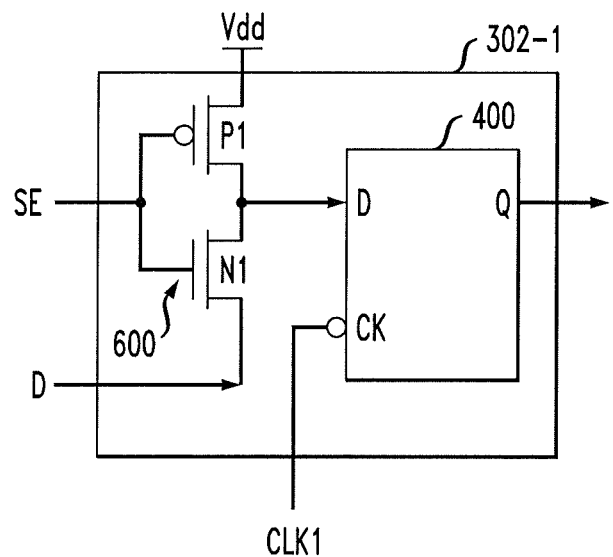
Figure 6B:
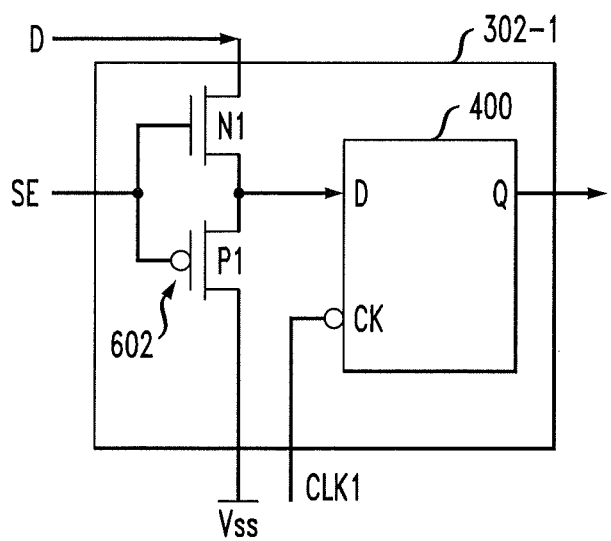

FIGS. 6A and 6B show embodiments in which the lockup latch 302-1 comprises flip-flop 400 and data input control circuitry in the form of an inverter 600 or 602 having an input configured to receive the scan enable signal SE, an output coupled to the data input of the flip-flop 400, and upper and lower supply inputs, with one of the supply inputs being configured to receive a data signal D and the other supply input being coupled to a supply line Vdd in FIG. 6A or Vss in FIG. 6B.

In the FIG. 6A embodiment, the inverter 600 comprises a P-type field effect transistor P1 and an N-type field effect transistor N1. The source of P1 corresponds to the upper supply input of the inverter 600 and the drain of P1 is coupled to the drain of N1 and to the data input of the flip-flop 400. The lower supply input of the inverter 600 corresponds to the source of N1. The gates of P1 and N1 are coupled together and to the SE input of the lockup latch 302-1. The upper supply input of the inverter is coupled to the Vdd supply line and the lower supply input of the inverter is configured to receive the data signal D.

In the FIG. 6B embodiment, the inverter 602 comprises the P-type field effect transistor P1 and the N-type field effect transistor N1, but the positions of these two transistors are reversed relative to the FIG. 6A embodiment. The drain of N1 corresponds to the upper supply input of the inverter 602 and the source of P1 is coupled to the source of N1 and to the data input of the flip-flop 400. The lower supply input of the inverter 602 corresponds to the drain of P1. The gates of P1 and N1 are again coupled together and to the SE input of the lockup latch 302-1. The lower supply input of the inverter is coupled to the Vss supply line and the upper supply input of the inverter is configured to receive the data signal D.

When the SE signal is at a logic high level and the scan chain is in the scan shift mode, P1 is off and N1 is on, such that data is applied via N1 to the data input of the flip-flop 400. However, when the SE signal is at a logic low level and the scan chain is in the functional mode, P1 is on and N1 is off, such that the data input of the flip-flop 400 is maintained at a substantially constant logic high value corresponding to Vdd in FIG. 6A or at a substantially constant logic low value corresponding to Vss in FIG. 6B.

The lockup latches 302 as described in conjunction with the embodiments of FIGS. 4, 5 and 6 allow power consumption to be significantly reduced in the functional mode of operation, while also facilitating design verification in the event that scan cells are moved during an integrated circuit design process. For example, if scan cells are moved during the design process in order to optimize congestion, routing or other design goals, but the lockup latches remain in their same positions, functional mode verification will not be adversely impacted, as the latching elements of the lockup latches are not receiving data in the functional mode. Thus, design verification issues relating to lockup latches can be substantially eliminated. As noted above, different lockup latch embodiments can be combined within a single scan chain or set of scan chains. Also, the lockup latches are applicable for use in both compressed and noncompressed scan testing environments.

It is to be appreciated that the particular circuitry arrangements shown in FIGS. 4, 5 and 6 are presented by way of illustrative example only, and numerous alternative arrangements of latching elements and other circuitry may be used to implement lockup latches with scan enable based data input control. This scan enable based data input control can be implemented in one or more of the illustrative embodiments without any significant negative impact on integrated circuit area requirements or functional timing requirements.

The presence of lockup latches of the type described above in conjunction with FIGS. 4, 5 and 6 within integrated circuit 104 may be made apparent to a test generation tool so that the tool can take the associated functionality into account in generating test patterns. In order to accomplish this, one or more input files describing the operation of this circuitry may be provided to the test generation tool.

Figure 7:
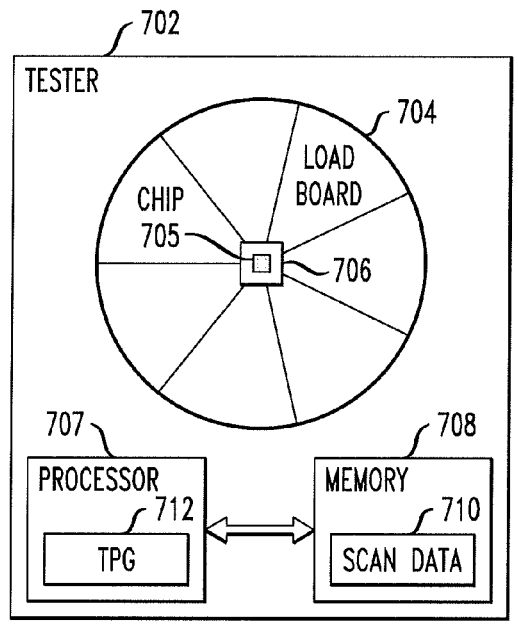
FIG. 7 shows one possible implementation of the testing system of FIG. 1.

The tester 102 in the testing system 100 of FIG. 1 need not take any particular form, and various conventional testing system arrangements can be modified in a straightforward manner to support the lockup latch functionality disclosed herein. One possible example is shown in FIG. 7, in which a tester 702 comprises a load board 704 in which an integrated circuit 705 to be subject to scan testing using the techniques disclosed herein is installed in a central portion 706 of the load board 704. The tester 702 also comprises processor and memory elements 707 and 708 for executing stored program code. In the present embodiment, processor 707 is shown as implementing a test pattern generator 712. Associated scan data 710 is stored in memory 708. Numerous alternative testers may be used to perform scan testing of an integrated circuit as disclosed herein. Also, as indicated previously, in alternative embodiments at least portions of the tester 702 may be incorporated into the integrated circuit itself, as in BIST arrangement.

Figure 8:
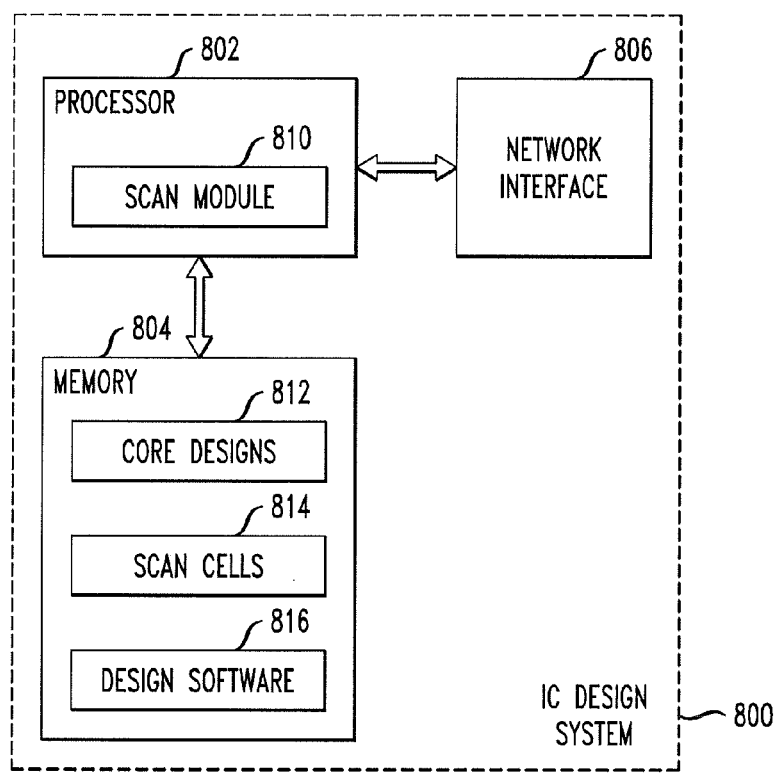
FIG. 8 is a block diagram of a processing system for generating an integrated circuit design comprising at least one scan chain having lockup latches of the type illustrated in FIGS. 4, 5 and 6.

The insertion of scan cells 206 and associated lockup latches 302 to form one or more scan chains 204 in scan test circuitry 106 of a given integrated circuit design may be performed in a processing system 800 of the type shown in FIG. 8. Such a processing system in this embodiment more particularly comprises a design system configured for use in designing integrated circuits such as integrated circuit 104 to include scan test circuitry 106 having scan chains 204.

The system 800 comprises a processor 802 coupled to a memory 804. Also coupled to the processor 802 is a network interface 806 for permitting the processing system to communicate with other systems and devices over one or more networks. The network interface 806 may therefore comprise one or more transceivers. The processor 802 implements a scan module 810 for supplementing core designs 812 with scan cells 814 and associated lockup latches in the manner disclosed herein, in conjunction with utilization of integrated circuit design software 816.

By way of example, the scan chain circuitry 106 comprising scan chains 204 with scan cells 206 and associated lockup latches 302 may be generated in system 800 using an RTL description and then synthesized to gate level using a specified technology library. A test generation model may then be created for generating test patterns using a test generation tool. Control files or other types of input files may be used to provide the test generation tool with information such as the particular sub-chains that are separated by lockup latches in a given embodiment. Once the corresponding rules are in place, a rule checker may be run so that the test generation tool has visibility of the scan chains taking into account the operation of the scan enable based data input control of the associated lockup latches. Test patterns may then be generated for the scan chain circuitry.

Elements such as 810, 812, 814 and 816 are implemented at least in part in the form of software stored in memory 804 and processed by processor 802. For example, the memory 804 may store program code that is executed by the processor 802 to implement particular scan chain and lockup latch functionality of module 810 within an overall integrated circuit design process. The memory 804 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 802 may comprise a microprocessor, CPU, ASIC, FPGA or other type of processing device, as well as portions or combinations of such devices. The memory 708 of FIG. 7 may be viewed as another illustrative example of a computer program product as the latter term is used herein.

As indicated above, embodiments of the invention may be implemented in the form of integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the embodiments of the invention as described herein are intended to be illustrative only. For example, other embodiments of the invention can be implemented using a wide variety of other types of scan test circuitry, with different types and arrangements of scan cells and associated lockup latches, as well as different types and arrangements of latch circuitry and control signaling, than those included in the embodiments described herein. These and numerous other alternative embodiments within the scope of the following claims will be readily apparent to those skilled in the art.

What is claimed is:

1. A scan chain lockup latch comprising:
at least one latching element; and
data input control circuitry configured to control application of data to a data input of the latching element responsive to a scan enable signal;
wherein the lockup latch is configured for coupling between first and second scan cells of a scan chain;
wherein the scan chain is controllable between a scan shift mode of operation and a functional mode of operation responsive to the scan enable signal; and
wherein the data input control circuitry is configured to maintain the data input of the latching element at a substantially constant logic value when the
scan chain is in its functional mode of operation such that switching activity in the latching element is suppressed in said functional mode.

2. The scan chain lockup latch of claim 1 wherein the latching element comprises at least one flip-flop.

3. The scan chain lockup latch of claim 1 wherein the data input control circuitry comprises logic circuitry having a first input configured to receive the scan enable signal, a second input configured to receive a data signal, and an output coupled to the data input of the latching element.

4. The scan chain lockup latch of claim 3 wherein the logic circuitry comprises one of a two-input AND gate and a two-input OR gate.

5. The scan chain lockup latch of claim 1 wherein the data input control circuitry comprises a multiplexer having a first selectable input configured to receive a data signal, a second selectable input configured to receive a substantially constant logic value, a control input configured to receive the scan enable signal, and an output coupled to the data input of the latching element.

6. The scan chain lockup latch of claim 1 wherein the substantially constant logic value is provided by coupling the second selectable input to one of a Vdd supply line and a Vss supply line.

7. The scan chain lockup latch of claim 1 wherein the data input control circuitry comprises an inverter having an input configured to receive the scan enable signal, an output coupled to the data input of the latching element, and upper and lower supply inputs, one of the supply inputs being configured to receive a data signal and the other supply input being coupled to a supply line.

8. The scan chain lockup latch of claim 7 wherein the upper supply input is coupled to a Vdd supply line and the lower supply input is configured to receive the data signal.

9. The scan chain lockup latch of claim 7 wherein the lower supply input is coupled to a Vss supply line and the upper supply input is configured to receive the data signal.

10. An integrated circuit comprising:
scan test circuitry; and
additional circuitry subject to testing utilizing the scan test circuitry;
the scan test circuitry comprising at least one scan chain having a plurality of scan cells;
the scan test circuitry further comprising at least one lockup latch, the lockup latch being arranged within the scan chain between first and second ones of the scan cells, wherein the lockup latch comprises:
at least one latching element; and
data input control circuitry configured to control application of data to a data input of the latching element responsive to a scan enable signal;
wherein the scan chain is controllable between a scan shift mode of operation and a functional mode of operation responsive to the scan enable signal; and
wherein the data input control circuitry is configured to maintain the data input of the latching element at a substantially constant logic value when the
scan chain is in its functional mode of operation such that switching activity in the latching element is suppressed in said functional mode.

11. The integrated circuit of claim 10 wherein the scan chain comprises a plurality of sub-chains associated with respective distinct clock domains, and wherein the scan chain lockup latch is coupled between a final scan cell of one of the sub-chains and a first scan cell of another one of the sub-chains.

12. A processing device comprising the integrated circuit of claim 10.

13. A method comprising:
configuring a lockup latch between first and second scan cells of a scan chain;
controlling application of data to a data input of a latching element of the lockup latch responsive to a scan enable signal; and
controlling the scan chain between a scan shift mode of operation and a functional mode of operation responsive to the scan enable signal;
wherein controlling application of data to the data input of the latching element further comprises maintaining the data input of the latching element at a substantially constant logic value when the scan chain is in its functional mode of operation such that switching activity in the latching element is suppressed in said functional mode.

14. A computer program product comprising a non-transitory computer-readable storage medium having computer program code embodied therein for use in scan testing an integrated circuit, wherein the computer program code when executed in a testing system causes the testing system to perform the steps of the method of claim 13.

15. A processing system comprising:
a processor; and
a memory coupled to the processor and configured to store information characterizing an integrated circuit design;
wherein the processing system is configured to provide scan test circuitry within the integrated circuit design, the scan test circuitry comprising at least one scan chain having a plurality of scan cells;
the scan test circuitry further comprising at least one lockup latch, the lockup latch being arranged within the scan chain between first and second ones of the scan cells, wherein the lockup latch comprises:
at least one latching element; and
data input control circuitry configured to control application of data to a data input of the latching element responsive to a scan enable signal;
wherein the scan chain is controllable between a scan shift mode of operation and a functional mode of operation responsive to the scan enable signal; and
wherein the data input control circuitry is configured to maintain the data input of the latching element at a substantially constant logic value when the
scan chain is in its functional mode of operation such that switching activity in the latching element is suppressed in said functional mode.

16. A scan chain lockup latch comprising:

at least one latching element; and data input control circuitry configured to control application of data to a data input of the latching element responsive to a scan enable signal;

wherein the lockup latch is configured for coupling between first and second scan cells of a scan chain; and wherein the data input control circuitry comprises logic circuitry having a first input configured to receive the scan enable signal, a second input configured to receive a data signal, and an output coupled to the data input of the latching element.

17. A scan chain lockup latch comprising:

at least one latching element; and data input control circuitry configured to control application of data to a data input of the latching element responsive to a scan enable signal;

wherein the lockup latch is configured for coupling between first and second scan cells of a scan chain; and wherein the data input control circuitry comprises a multiplexer having a first selectable input configured to receive a data signal, a second selectable input configured to receive a substantially constant logic value, a control input configured to receive the scan enable signal, and an output coupled to the data input of the latching element.

18. A scan chain lockup latch comprising:

at least one latching element; and data input control circuitry configured to control application of data to a data input of the latching element responsive to a scan enable signal;

wherein the lockup latch is configured for coupling between first and second scan cells of a scan chain; and wherein the data input control circuitry comprises an inverter having an input configured to receive the scan enable signal, an output coupled to the data input of the latching element, and upper and lower supply inputs, one of the supply inputs being configured to receive a data signal and the other supply input being coupled to a supply line.

* * * * *